United States Patent
Yoon et al.

(10) Patent No.: US 8,969,167 B2
(45) Date of Patent: Mar. 3, 2015

(54) METHODS OF FABRICATING A SEMICONDUCTOR DEVICE WITH CAPACITORS USING MOLD STRUCTURE AND PROTECTION LAYER

(71) Applicant: Samsung Electronics Co., Ltd., Suwon-si, Gyeonggi-do (KR)

(72) Inventors: Junho Yoon, Suwon-si (KR); Dongchan Kim, Seoul (KR); Gyungjin Min, Seongnam-si (KR); Jaehong Park, Seongnam-si (KR); Yongmoon Jang, Yeonsu-gu (KR); Je-Woo Han, Hwasung-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/952,207

(22) Filed: Jul. 26, 2013

(65) Prior Publication Data

US 2014/0065784 A1    Mar. 6, 2014

(30) Foreign Application Priority Data

Aug. 29, 2012    (KR) .......................... 10-2012-0095086

(51) Int. Cl.
*H01L 21/20*    (2006.01)
*H01L 49/02*    (2006.01)

(52) U.S. Cl.
CPC .............. *H01L 28/40* (2013.01); *H01L 28/90* (2013.01)
USPC ...................................................... 438/381

(58) Field of Classification Search
None
See application file for complete search history.

(56) References Cited

U.S. PATENT DOCUMENTS

| 5,933,742 | A | 8/1999 | Wu |
|---|---|---|---|
| 6,071,774 | A | 6/2000 | Sung et al. |
| 7,312,120 | B2 | 12/2007 | Shea |
| 7,524,774 | B2 | 4/2009 | Sasaki et al. |
| 8,119,476 | B2 | 2/2012 | Kang et al. |
| 2007/0254389 | A1* | 11/2007 | Oh et al. .......................... 438/20 |
| 2008/0003766 | A1* | 1/2008 | Eun ................ 438/396 |
| 2010/0188795 | A1* | 7/2010 | Kim et al. ...................... 361/272 |

FOREIGN PATENT DOCUMENTS

| KR | 10-2006-0001116 A | 1/2006 |
|---|---|---|
| KR | 10-0602737 B1 | 7/2006 |
| KR | 10-2006-0097306 A | 9/2006 |
| KR | 10-0709578 B1 | 4/2007 |
| KR | 10-2008-0001447 A | 1/2008 |
| KR | 10-035395 B1 | 5/2011 |
| KR | 10-1090470 B1 | 11/2011 |

* cited by examiner

*Primary Examiner* — Yasser A Abdelaziez
(74) *Attorney, Agent, or Firm* — Myers Bigel Sibley & Sajovec, P.A.

(57) ABSTRACT

A method of fabricating a semiconductor device with capacitors may include forming a mold structure on a lower structure, patterning the mold structure to form a plurality of holes exposing the lower structure, forming a protection layer on sidewalls of the mold structure exposed by the holes, forming lower electrodes in the holes provided with the protection layer, removing the mold structure to expose the protection layer, removing the protection layer to expose sidewalls of the lower electrodes, and sequentially forming a dielectric film and an upper electrode on the lower electrodes.

16 Claims, 21 Drawing Sheets

METHODS OF FABRICATING A SEMICONDUCTOR DEVICE WITH CAPACITORS USING MOLD STRUCTURE AND PROTECTION LAYER

CROSS-REFERENCE TO RELATED APPLICATION

This U.S. non-provisional patent application claims priority under 35 U.S.C. §119 to Korean Patent Application No. 10-2012-0095086, filed on Aug. 29, 2012, in the Korean Intellectual Property Office, the entire contents of which are hereby incorporated by reference.

BACKGROUND OF THE INVENTION

Example embodiments of the inventive concepts relate to methods of fabricating a semiconductor device, and in particular, to methods of fabricating a semiconductor device with capacitors.

As semiconductor devices become more highly integrated, a capacitor having sufficient capacitance in a limited area is desired. The capacitance of a capacitor is proportional to a surface area of an electrode and a dielectric constant of dielectric film and is inversely proportional to an equivalent oxide thickness of the dielectric film. In methods for increasing the capacitance of capacitor in a limited area, a surface area of an electrode may be increased by forming a capacitor of a three dimensional structure, an equivalent oxide thickness of dielectric film may be reduced and a dielectric film having a high dielectric constant may be used.

In methods that increase the surface area of electrode, a height of lower electrode (or a storage electrode) may be increased, an effective surface area of lower electrode using a hemi-spherical grain (HSG) may be enlarged and an inside area and an outside area of cylinder using one cylinder storage (OCS) electrode may be used. As a dielectric film having a high dielectric constant, there may be a metal oxide film such as $TiO_2$ and $Ta_2O_5$ or a ferroelectric of perovskite structure.

SUMMARY

Example embodiments of the inventive concepts provide methods of fabricating a semiconductor device that can have improved reliability.

According to example embodiments of the inventive concepts, a method of fabricating a semiconductor device may include forming a mold structure on a lower structure, patterning the mold structure to form a plurality of holes exposing the lower structure, forming a protection layer on sidewalls of the mold structure exposed by the holes, forming lower electrodes in the holes provided with the protection layer, removing the mold structure to expose the protection layer, removing the protection layer to expose sidewalls of the lower electrodes, and sequentially forming a dielectric film and an upper electrode on the lower electrodes.

In example embodiments, the protection layer may comprise a material having an etch selectivity with respect to the mold structure and the lower electrodes.

In example embodiments, the protection layer may comprise a silicon oxide layer, a silicon nitride layer, or a silicon oxynitride layer.

In example embodiments, the forming of the protection layer may include depositing a surface protection layer conformally on a surface of the mold structure with the holes, and removing the surface protection layer from a top surface of the lower structure exposed by the holes to expose the top surface of the lower structure.

In example embodiments, the forming of the protection layer may include treating the sidewalls of the mold structure exposed by the holes with plasma produced from at least one of hydrogen, oxygen, or nitrogen.

In example embodiments, the forming of the mold structure may include sequentially stacking the mold layer and a supporting layer having an etch selectivity with respect to the mold layer, on the lower structure.

In example embodiments, the protection layer may be locally formed on the sidewall of the mold layer to expose a sidewall of the supporting layer.

In example embodiments, the removing of the protection layer may include locally forming a protection pattern between the lower electrodes and the supporting layer.

In example embodiments, the supporting layer may have openings exposing portions of the mold layer.

In example embodiments, the removing of the mold structure may be performed to remove the mold layer using an isotropic etching process having an etch selectivity with respect to the protection layer and the supporting layer.

In example embodiments, the method may further include after forming the lower electrodes, patterning the supporting layer to form a supporting pattern with openings partially exposing sidewalls of the lower electrodes.

In example embodiments, the mold layer may be formed of a single-crystalline silicon layer, an amorphous silicon layer, a doped silicon layer, a silicon germanium layer, or a carbon-based material.

In example embodiments, the supporting layer may be formed of SiN, SiCN, TaO, or $TiO_2$.

In example embodiments, a width of the lower electrode may be smaller than that of the hole.

According to other example embodiments of the inventive concepts, a method of fabricating the semiconductor device may include forming on a first structure, a second structure having a plurality of holes therein that expose the first structure, forming a first layer on sidewalls of the second structure that are exposed by the holes, forming a second layer that is conductive, on inner sidewalls of the first layer in the holes, removing the first structure to expose outer sidewalls of the first layer, removing the first layer to expose the second layer, forming a third layer that is insulating, on the second layer that was exposed, and forming a fourth layer that is conductive, on the third layer.

In example embodiments, the method may further comprise forming a fifth layer on the second structure prior to the removing the first structure, wherein at least some of the fifth layer remains between adjacent outer sidewalls of the first layer after the removing the first structure to expose outer sidewalls of the first layer. In other example embodiments, at least some of the fifth layer remains between adjacent outer sidewalls of the first layer after the removing the first structure to expose outer sidewalls of the first layer and after the removing the first layer to expose the second layer.

In still other example embodiments, the forming a second layer comprises forming a second layer that is conductive, on inner sidewalls of the first layer in the holes, so as to not fill the holes. In yet other example embodiments, the forming a third layer comprises forming a third layer that is insulating, on the second layer that was exposed, so as to not fill the holes. In other example embodiments, the forming a first layer comprises surface treating the sidewalls of the second structure that are exposed by the holes.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
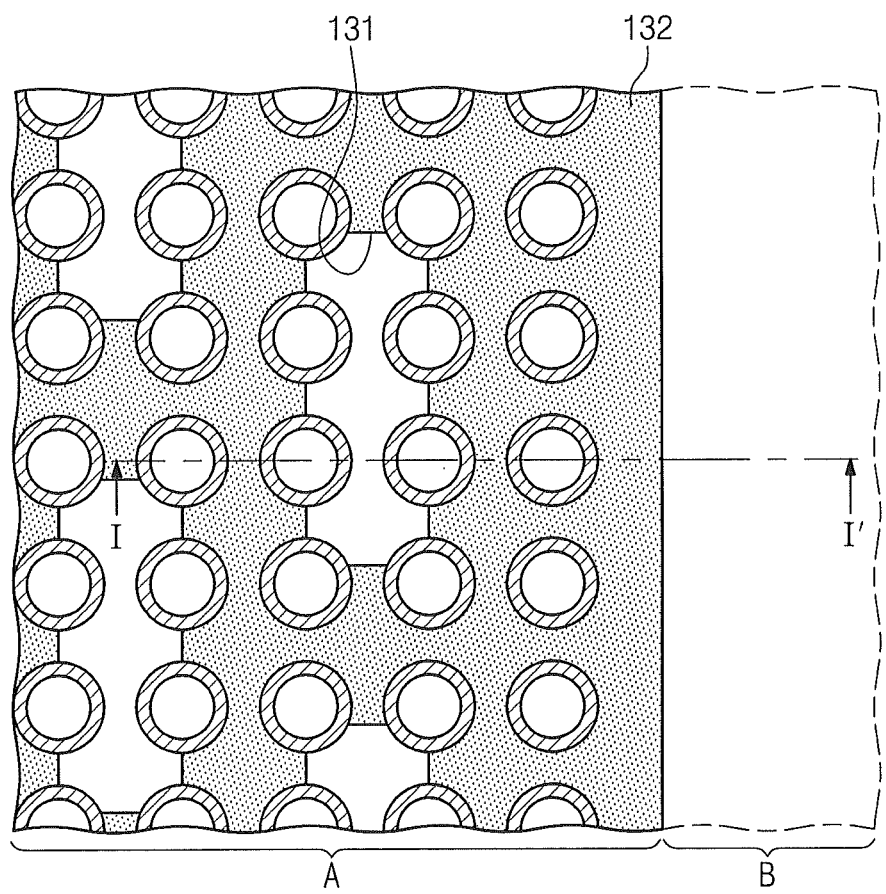
FIG. 1 is a plan view illustrating a semiconductor device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view illustrating a semiconductor device according to example embodiments of the inventive concepts, and FIGS. 2 through 11 are sectional views illustrating a method of fabricating a semiconductor device according to example embodiments of the inventive concepts and taken along line I-I' of FIG. 1.

Figure 2:
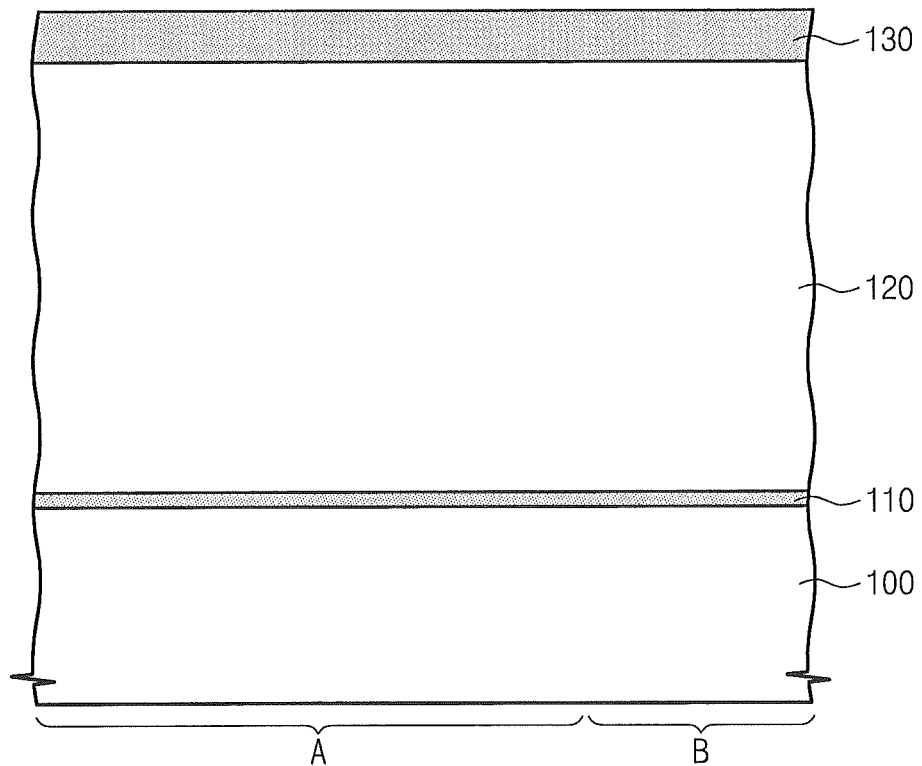
FIGS. 2 through 11 are sectional views illustrating a method of fabricating a semiconductor device according to example embodiments of the inventive concepts and taken along line I-I' of FIG. 1.

Referring to FIGS. 1 and 2, provided is a lower structure 100 including a semiconductor substrate, semiconductor devices, and interlayered insulating layers.

For example, the semiconductor substrate may include a cell region A, in which memory cells will be formed, and a peripheral circuit region B, in which peripheral circuits for controlling the memory cells will be formed. The semiconductor devices may include, for example, MOS transistors, diodes, and resistors. In example embodiments, gate lines and bit lines may be formed on the cell region A of the semiconductor substrate. In addition, source/drain electrodes of the MOS transistor and contact plugs connected to the gate lines may be formed on the cell region A of the semiconductor substrate.

The uppermost layer of the lower structure 100 may be an interlayered insulating layer with a planarized top surface. The interlayered insulating layer may include at least one of high density plasma (HDP) oxide, TEOS (TetraEthylOrthoSilicate), PE-TEOS (Plasma Enhanced TetraEthylOrthoSilicate), $O_3$-TEOS ($O_3$-Tetra Ethyl Ortho Silicate), USG (Undoped Silicate Glass), PSG (PhosphoSilicate Glass), BSG (Borosilicate Glass), BPSG (BoroPhosphoSilicate Glass), FSG (Fluoride Silicate Glass), SOG (Spin On Glass), TOSZ (Tonen SilaZene) or any combination thereof. Alternatively, the interlayered insulating layer may include at least one of silicon nitride, silicon oxynitride, or low-k materials.

Next, as shown in FIG. 2, a mold structure may be formed on the lower structure 100 to include a mold layer 120 and a supporting layer 130 that are sequentially stacked on the lower structure 100.

In example embodiments, the mold layer 120 may be formed of a semiconductor material. For example, the mold layer 120 may be formed of a single-crystalline silicon layer, an amorphous silicon layer, a doped silicon layer, a silicon germanium layer, or a carbon-based material. Alternatively, the mold layer 120 may be formed of a silicon oxide layer. In example embodiments, the mold layer 120 may be formed to a thickness of about 5000 Å-10000 Å. The mold layer 120 may be formed using a deposition process, such as a chemical vapor deposition (CVD) or a physical vapor deposition (PVD).

Furthermore, before the formation of the mold layer 120, an etch stop layer 110 may be formed on the planarized top surface of the lower structure 100. The etch stop layer 110 may be formed of a material having an etch selectivity with respect to the planarized interlayered insulating layer of the lower structure 100 and the mold layer 120. For example, the etch stop layer 110 may be formed of a silicon nitride layer or a silicon oxynitride layer.

The supporting layer 130 may be formed of a material having an etch selectivity with respect to the mold layer 120. In example embodiments, the supporting layer 130 may be formed of one of SiN, SiCN, TaO, and $TiO_2$. The supporting layer 130 may be formed to a thickness of about 100 Å-500 Å.

Figure 3:
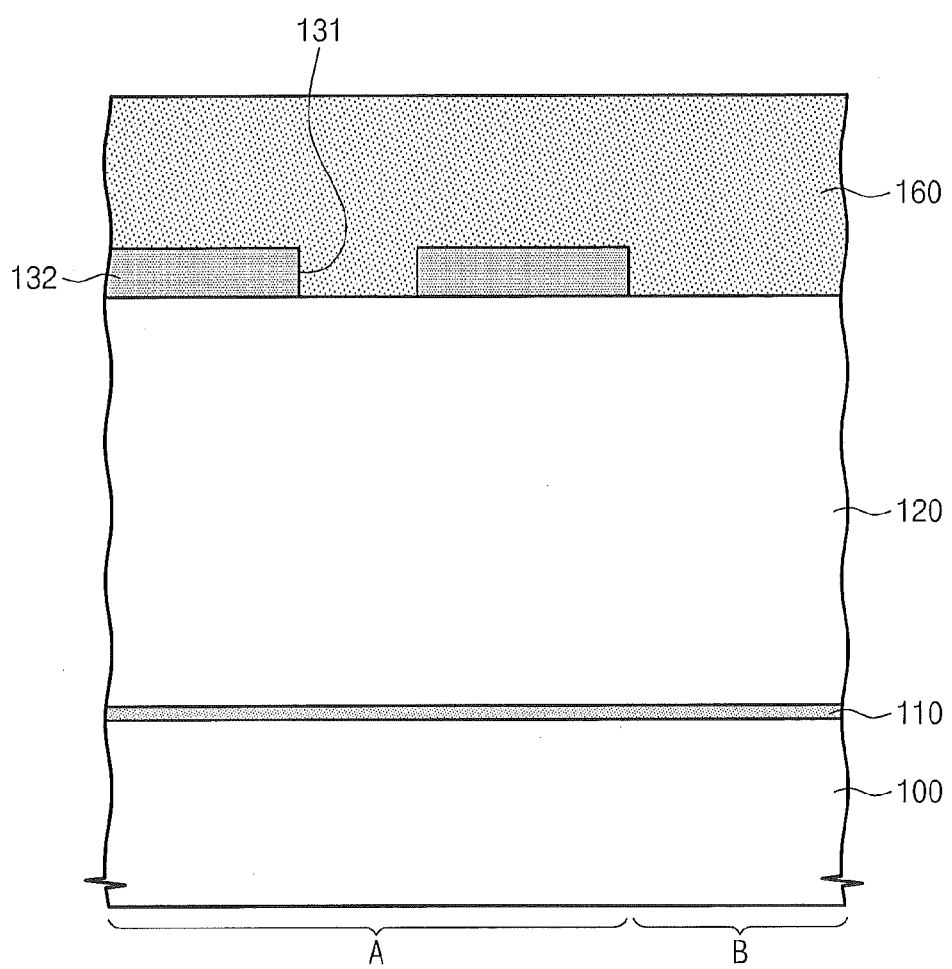

In other example embodiments, as shown in FIG. 3, a mold structure may be formed to include the mold layer 120 on the lower structure 100 and a supporting pattern 132 with openings 131 exposing the mold layer 120. Here, the supporting pattern 132 with the openings 131 may be formed by forming the supporting layer 130 on the mold layer 120, forming a mask pattern (not shown) having openings on the supporting layer 130, and then, anisotropically etching the supporting layer 130 using the mask pattern as an etch mask. As a result, the supporting pattern 132 may be formed to have the openings 131 exposing the mold layer 120 in the cell region A. In addition, the supporting pattern 132 may be formed to expose the mold layer 120 on the peripheral circuit region B. For example, as shown in FIG. 1, the supporting pattern 132 may be formed to include the openings 131 shaped like a bar. The bar-shaped openings 131 may be two-dimensionally arranged along column and row directions or arranged to have a zigzag arrangement. Alternatively, the supporting pattern 132 may be formed to include the openings 131 shaped like a line or stripe. A sacrificial mask layer 160 may be formed on the supporting pattern 132 with the openings 131. In example embodiments, the sacrificial mask layer 160 may be formed to fill the openings 131.

In still other embodiments, the mold structure on the lower structure 100 may include a plurality of stacked mold layers and lower and upper supporting layers between the mold layers.

Figure 4:
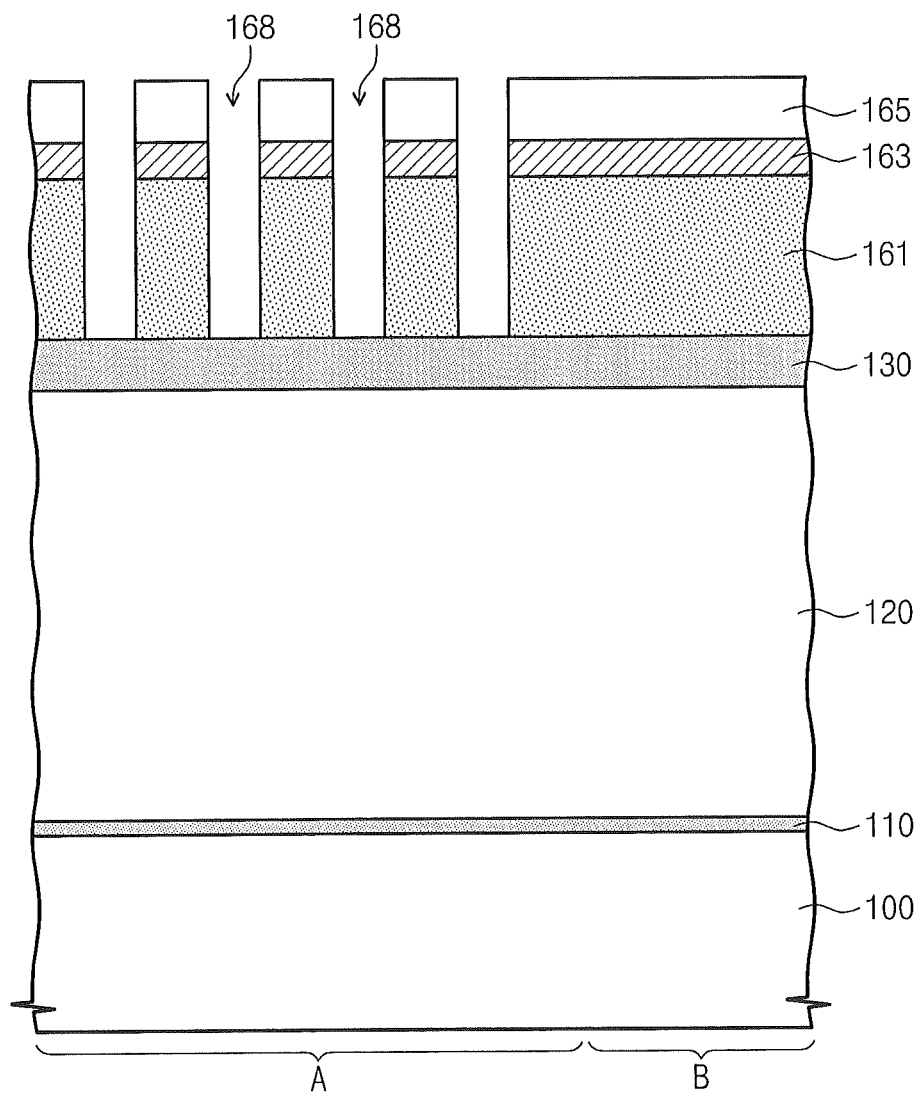

After the formation of the mold structures on the lower structure 100 as described with reference to FIGS. 2 and 3, lower electrode holes H may be formed. For example, as shown in FIGS. 1 and 4, a mask structure for forming the lower electrode holes H may be formed on the mold structure. Since the mold layer 120 is thick, the mask structure may be formed of a material having high etch selectivity with respect to the mold layer 120. In example embodiments, the mask structure may be formed of at least one of materials capable of having high etch selectivity with respect to the mold layer 120 and the supporting layer 130, during an anisotropic etching process to form the lower electrode holes H.

The mask structure may be formed to have openings 168 that are two-dimensionally arranged along column and row directions, when viewed from a plan view. Alternatively, in plan view, the mask structure may be formed to include the openings 168, whose longitudinal axis is parallel to a diagonal direction, or which are arranged in a zigzag manner.

In detail, the mask structure may include a sacrificial mask layer 161, a hard mask layer 163, and an organic mask layer 165 that are sequentially stacked one on another. The formation of the mask structure may include patterning the organic mask layer 165 using the mask pattern (not shown), and then, sequentially and anisotropically etching the hard mask layer 163 and the sacrificial mask layer 161 using the patterned organic mask layer 165 to form the openings 168. After the formation of the openings 168, the organic mask layer 165 may be removed by, for example, an ashing process.

The sacrificial mask layer 161 may be formed of a material having etch selectivity with respect to the mold layer 120 and the supporting layer 130. For example, the sacrificial mask layer 161 may be formed of a silicon oxide layer (e.g., high density plasma (HDP) oxide, TEOS (Tetra Ethyl Ortho Silicate), PE-TEOS (Plasma Enhanced TEOS), $O_3$-TEOS, and USG (Undoped Silicate Glass)).

The hard mask layer 163 may be formed of an inorganic material having an etch selectivity with respect to the sacrificial mask layer 161 in a process of etching the sacrificial mask layer 161. For example, the hard mask layer 163 may be formed of a silicon-containing material selected from the group consisting of polysilicon, SiON, $Si_3N_4$, or SiCN.

The organic mask layer 165 may be formed of an organic material having an etch selectivity with respect to the hard mask layer 163 in a process of etching the hard mask layer 163. For example, the organic mask layer 165 may be formed of a spin on hardmask (SOH) layer or an amorphous carbon layer (ACL). The SOH layer may include a carbon-based SOH layer or a silicon-based SOH layer.

In the case where the mask structure is formed on the mold structure shown in FIG. 3, the sacrificial mask layer 161 may be formed to fill the openings (131 of FIG. 3) formed in the supporting layer 130.

Figure 5:
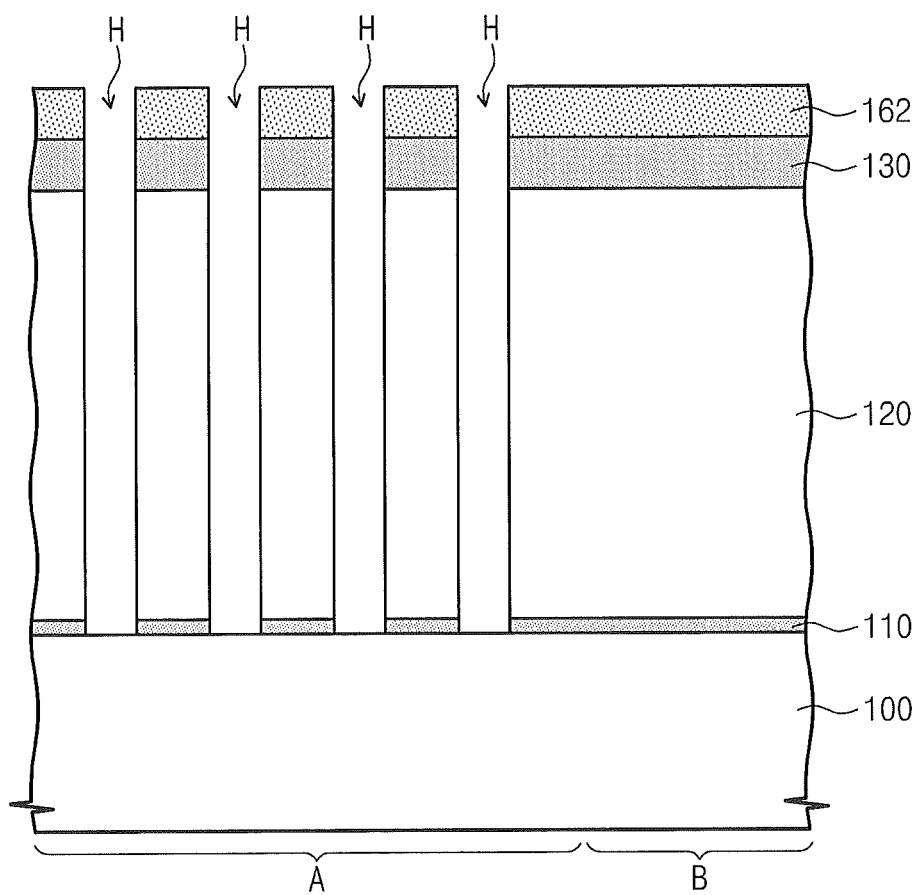

Next, as shown in FIG. 5, the lower electrode holes H may be formed to expose the lower structure 100 through the mold structures. For example, the formation of the lower electrode holes H may include sequentially and anisotropically etching the supporting layer 130 and the mold layer 120 using the mask structure as an etch mask.

The anisotropic etching process for forming the lower electrode holes H may be performed using an etch recipe selected in such a way that a difference in etch rate between the mold layer 120 and the supporting layer 130 is lower than 10%. The anisotropic etching process for forming the lower electrode holes H may be performed using an etching gas for etching the mold layer 120 and an etching gas for etching the supporting layer 130. In the case where the lower electrode holes H has a high aspect ratio, the hard mask layer 163 may be removed and a top surface of the sacrificial mask layer 160 may be recessed during the formation of the lower electrode holes H. The sacrificial mask layer 160 remaining on the supporting layer 130 may be used as a portion of the mold structure in a process of forming lower electrodes (180 of FIG. 6).

The lower electrode holes H may be two-dimensionally arranged along column and row directions, when viewed from a plan view, as shown in FIG. 1. Alternatively, in plan view, the lower electrode holes H may have longitudinal axis parallel to a diagonal direction and be arranged in a zigzag manner. In addition, as the result of the anisotropic etching process, the lower electrode holes H may be formed to have a lower width smaller than an upper width. The anisotropic etching process for forming the lower electrode holes H may be performed in an over-etch manner, and a portion of the etch stop layer 110 may be removed to expose the top surface of the lower structure 100.

Figure 6:
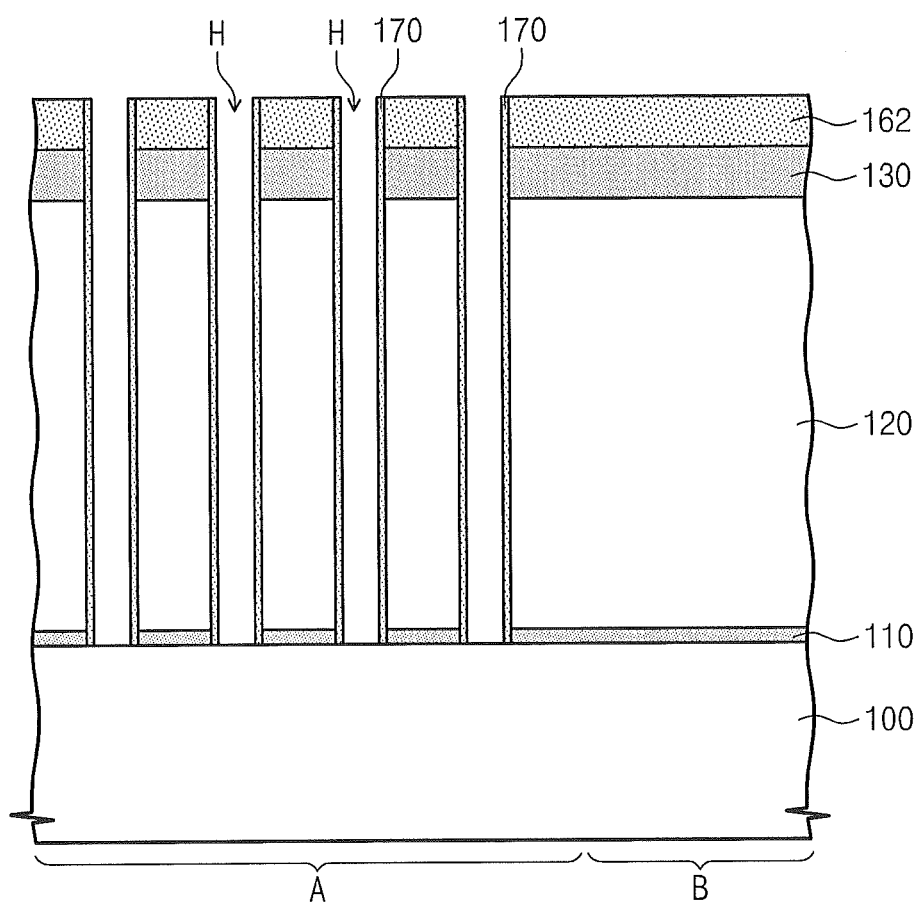

Referring to FIG. 6, a protection layer 170 may be formed to cover a sidewall of the mold structure exposed by the lower electrode holes H. The protection layer 170 may be formed of a material having an etch selectivity with respect to the lower electrode 180, which will be formed in a subsequent process, and the mold layer 120. For example, the protection layer 170 may be formed of at least one of a silicon oxide layer, a silicon nitride layer, or a silicon oxynitride layer. The protection layer 170 may be formed to a thickness of about 10 Å-50 Å.

In example embodiments, the formation of the protection layer 170 may include depositing a surface protection layer to cover conformally a surface of the mold structure with the lower electrode holes H, and then, performing an anisotropic etching process to the surface protection layer to remove the surface protection layer from the top surface of the lower structure exposed by the lower electrode holes H.

The surface protection layer may be formed using a deposition process having a good step coverage property, such as a chemical vapor deposition (CVD), a physical vapor deposition (PVD) or an atomic layer deposition (ALD). The surface protection layer may cover bottom surfaces of the lower electrode holes H. Accordingly, to expose the top surface of the lower structure 100, the surface protection layer may be removed from the bottom surfaces of the lower electrode holes H, after the deposition of the surface protection layer. In example embodiments, since the lower electrode holes H have a high aspect ratio, the removal of the surface protection layer from the bottom surfaces of the lower electrode holes H may be performed using a capacitive coupled plasma (CCP) dry etching process. For example, in the case where the protection layer 170 is formed of a silicon nitride layer, a CxFy-based or CxHyFz-based etching gas may be used in the etching process to remove the surface protection layer from the bottom surfaces of the lower electrode holes H. As a result, the protection layer 170 having a spacer-shaped structure may be formed on the sidewalls of the lower electrode holes H.

Figure 7:
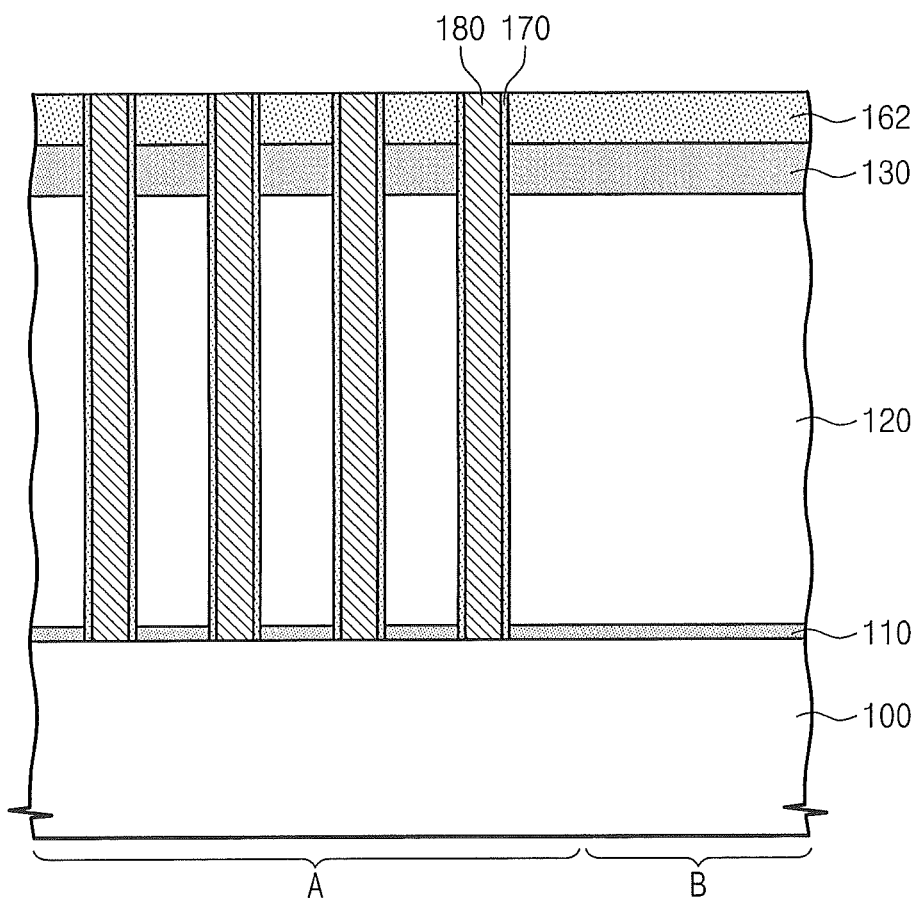

Referring to FIG. 7, lower electrodes 180 may be formed in the lower electrode holes H provided with the protection layer 170.

The formation of the lower electrodes 180 may include depositing a conductive layer to fill the lower electrode holes H provided with the protection layer 170, and performing a planarization process to remove the conductive layer from the top surface of the sacrificial mask layer 160 and separate the lower electrodes 180 from each other. In example embodiments, since the lower electrodes 180 are formed in the lower electrode holes H provided with the protection layer 170, the lower electrode 180 may have a width smaller than that of the lower electrode hole H.

Figure 12:
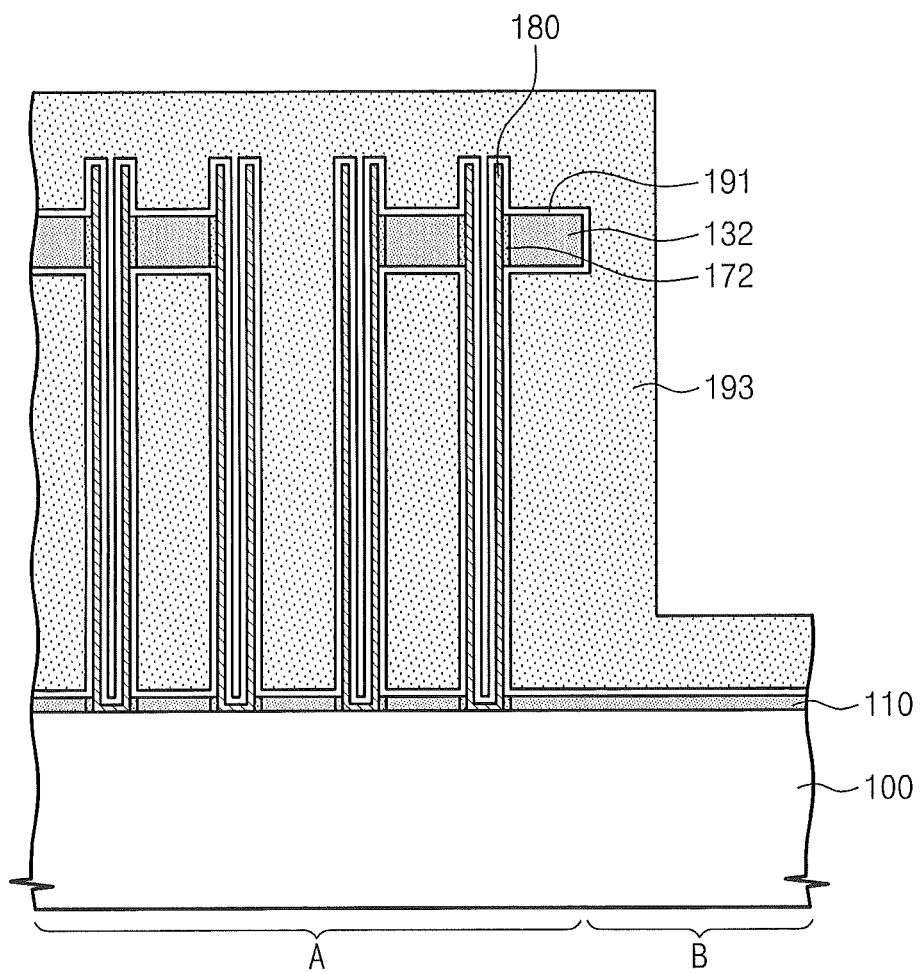
FIG. 12 is a sectional view illustrating a modified structure of a lower electrode, which may be formed by a method of fabricating a semiconductor device according to example embodiments of the inventive concepts.

The conductive layer may be formed using a deposition process having a good step coverage property, such as a chemical vapor deposition (CVD), a physical vapor deposition (PVD) or an atomic layer deposition (ALD). In example embodiments, the conductive layer may be formed to have a thickness greater than half a width of each of the lower electrode holes H, thereby filling the lower electrode holes H completely. Accordingly, as shown, the lower electrodes 180 may be formed to have a pillar-shaped structure. In other example embodiments, the conductive layer may be formed to have a thickness smaller than half the width of each of the lower electrode holes H, thereby covering conformally an inner surface of each of the lower electrode holes H. In this case, after the deposition of the conductive layer, a sacrificial layer may be formed on the conductive layer to fill remaining spaces of the lower electrode holes H, and, thus, as shown in FIG. 12, the lower electrodes 180 may be formed to have a cylindrical structure.

After the deposition of the conductive layer, a plasma treatment process and/or a thermal treatment process may be performed to remove impurities or by-products that may be produced during the deposition of the conductive layer. The plasma treatment process may be performed using $N_2$ and $H_2$ plasma.

The planarization process may be, for example, a chemical mechanical polishing process or a dry etch-back process. As the result of the planarization process, the lower electrodes 180 may have top surfaces that are coplanar with that of the sacrificial mask layer. In addition, as the result of the planarization process, the lower electrodes 180 may be separated from each other and the sacrificial mask layer 160 may be removed from the top surface of the supporting layer 130.

In example embodiments, the lower electrode 180 may include at least one of metals, metal nitrides, or metal silicides. For example, the lower electrode 180 may be formed of high melting point metals (such as, cobalt, titanium, nickel, tungsten and molybdenum). In other example embodiments, the lower electrode 180 may be formed of a metal nitride layer (e.g., of titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), or tungsten nitride (WN)). In still other embodiments, the lower electrode 180 may be formed of at least one selected from a group of noble metals consisting of platinum (Pt), ruthenium (Ru), and iridium (Ir). In even other embodiments, the lower electrode 180 may be formed of a conductive noble metal oxide layer such as PtO, $RuO_2$ or $IrO_2$ and a conductive oxide film such as SRO($SrRuO_3$), BSRO (Ba, Sr)$RuO_3$, CRO($CaRuO_3$) or LSCo.

Figure 8:
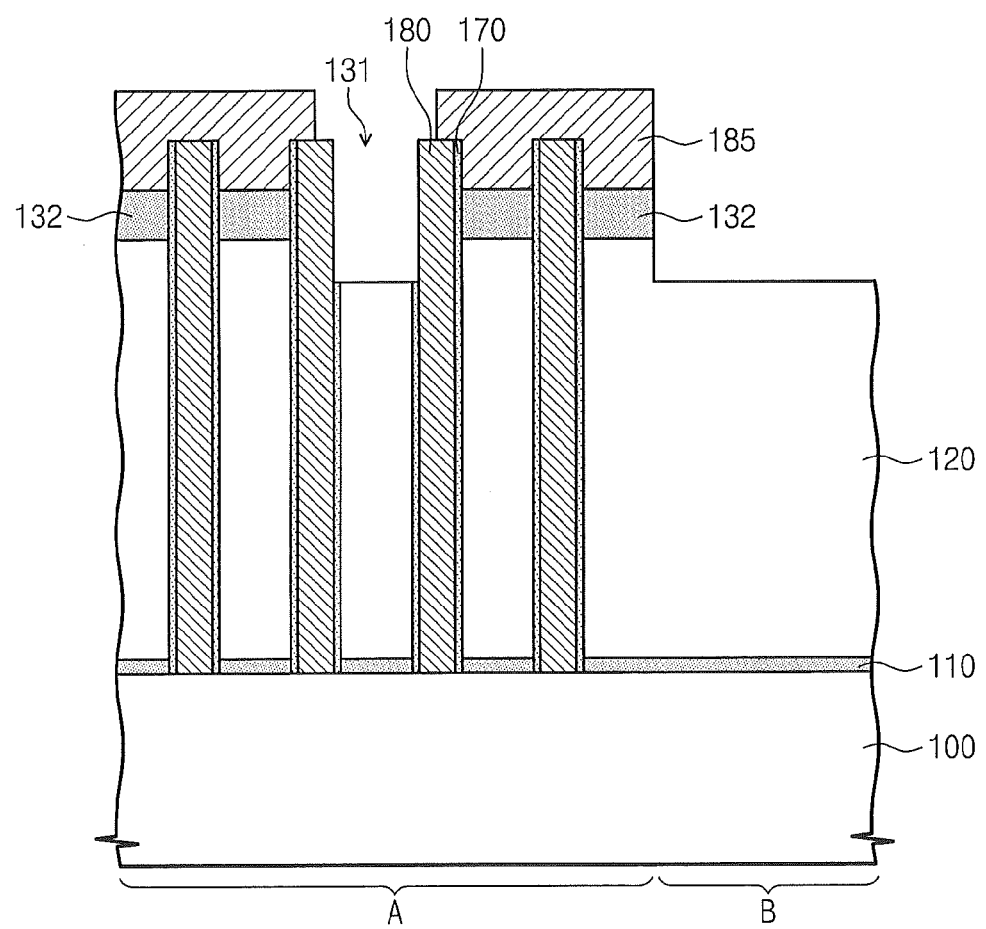

Referring to FIGS. 1 and 8, the supporting layer 130 may be patterned to form a supporting pattern 132. The formation of the supporting pattern 132 may include forming a mask pattern 185 on the lower electrodes 180 to expose portions of the supporting layer 130, and then, anisotropically etching the supporting layer 130 using the mask pattern 185 as an etch mask to form openings exposing portions of the mold layer 120. In certain embodiments, the mask pattern 185 may be formed on the sacrificial mask layer 161. The mask pattern 185 may be removed after the formation of the supporting pattern 132.

The supporting pattern 132 may be horizontally connected to sidewalls of the lower electrodes 180, but the sidewalls of the lower electrodes 180 may be exposed by the supporting pattern 132 at predetermined regions. The supporting pattern 132 may have an etch selectivity with respect to the mold layer 120 in a subsequent process of removing the mold layer 120, and thus, the supporting pattern 132 can prevent the lower electrodes 180 having a high aspect ratio from falling.

In example embodiments, the anisotropic etching process for forming the supporting pattern 132 may be performed using a plasma etching technique. For example, in the case where the supporting layer 130 is formed of a silicon nitride layer, a CxFy-based or CxHyFz-based etching gas may be used in the plasma etching process.

In example embodiments, the protection layer 170 exposed by the openings 131 may be partially etched during the formation of the openings 131. When the supporting layer 130 is anisotropically etched, a top surface of the mold layer 120 may be over-etched and recessed. In the case where the CxFy-based or CxHyFz-based etching gas is used to etch the supporting layer 130 anisotropically, the etching gas may be reacted with the lower electrode 180 to produce polymer on a surface of the mold layer 120. In this case, after the formation of the supporting pattern 132, an isotropic etching process may be performed to remove residue (e.g., the polymer) from the surface of the mold layer 120.

Figure 9:
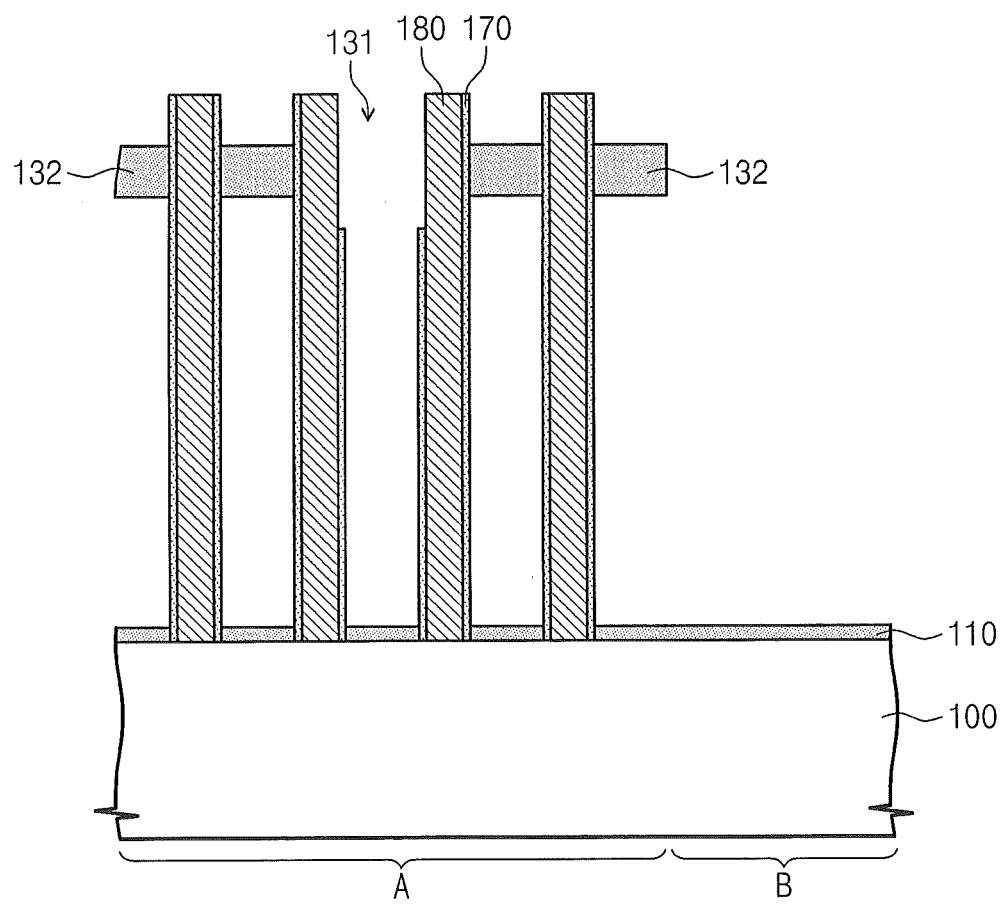

Referring to FIG. 9, the mold layer 120 may be removed. In example embodiments, the mold layer 120 may be removed using an isotropic etching process. For example, the removal of the mold layer 120 may be performed using an etch recipe having an etch selectivity with respect to the supporting pattern 132 and the protection layer 170. The removal of the mold layer 120 may include supplying a wet etching solution to the mold layer 120 through the openings 131 and the peripheral circuit region B. Side products may be produced by a chemical reaction between the mold layer 120 and the etching solution. In particular, in the case where the mold layer 120 is in direct contact with the lower electrode 180, the side products (e.g., silicon residues) may remain on the sidewalls of the lower electrodes 180. For example, in the case where the mold layer 120 is formed of a silicon-based material, an etching solution having a hydroxyl group (OH) may be used to remove the mold layer 120. For example, in the case where the mold layer 120 is formed of a silicon-based material, potassium hydroxide (KOH), ammonium hydroxide ($NH_4OH$), sodium hydroxide (NaOH), or tetramethyl ammonium hydroxide (TMAH) may be used as the etching solution. In this case, silicon residues may be produced by a chemical reaction between silicon and hydroxyl group, thereby causing hardship to the removal of the mold layer 120. Accordingly, the mold layer 120 may not be completely removed by the isotropic etching process. In the meantime, since the protection layer 170 is formed to cover the sidewalls of the lower electrodes 180 in the isotropic etching process, it is possible to prevent the sidewalls of the lower electrodes 180 from being exposed to the etching solution in the removal process of the mold layer 120.

As the result of the removal of the mold layer 120, the protection layer 170 surrounding the sidewalls of the lower electrodes 180 may be exposed. In addition, it is possible to prevent the lower electrodes 180 from falling, because the sidewalls of the lower electrodes 180 are horizontally and partially connected to each other by the supporting pattern 132.

Figure 10:
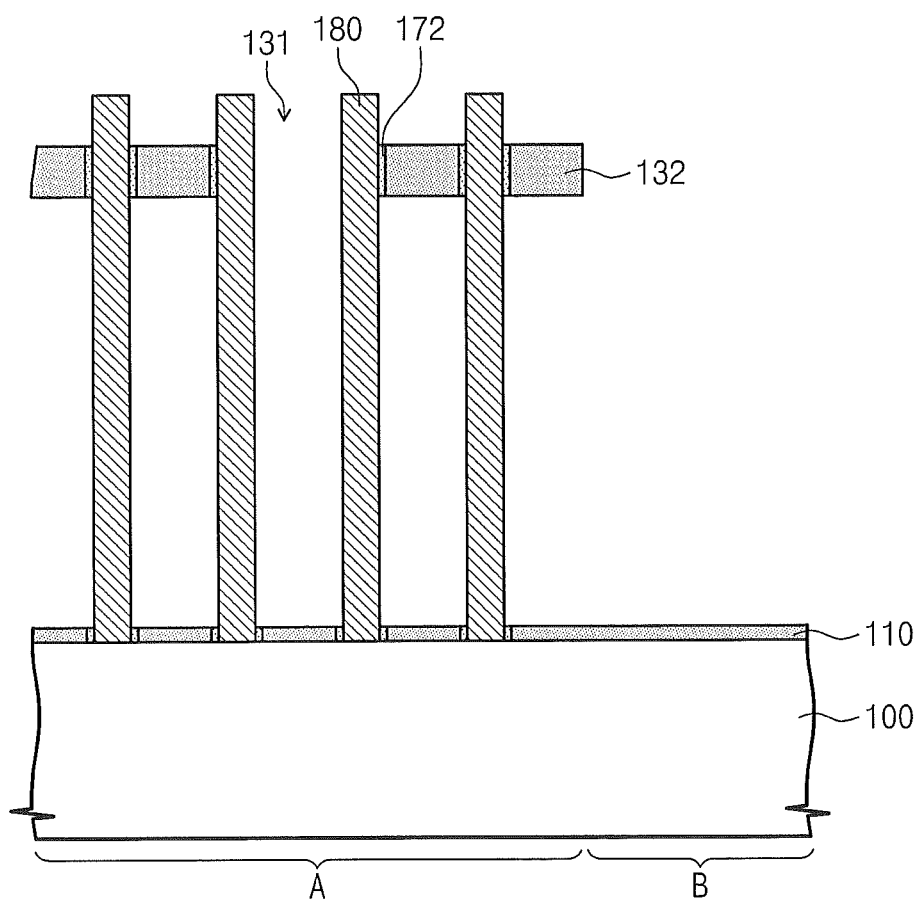

Next, the protection layer 170 surrounding the lower electrodes 180 may be removed to expose the sidewalls of the lower electrodes 180 as shown in FIG. 10. The protection layer 170 may be removed using an isotropic etching process, and an etch recipe having an etch selectivity with respect to the supporting pattern 132 and the lower electrodes 180 may be used. For example, in the case where the protection layer 170 is formed of a silicon nitride layer, a phosphoric acid solution may be used to remove the protection layer 170. In the case where the protection layer 170 is formed of a silicon oxide layer, a limulus amoebocyte lysate (LAL) solution may be used to remove the protection layer 170.

A portion of the protection layer 170 (or a protection pattern) may remain between the supporting pattern 132 and the lower electrodes 180, after the isotropic etching process of the protection layer 170. If the protection layer 170 is formed of the same material as the supporting pattern 132, a thickness of the supporting pattern 132 may decrease in the isotropic etching process of the protection layer 170.

Figure 11:
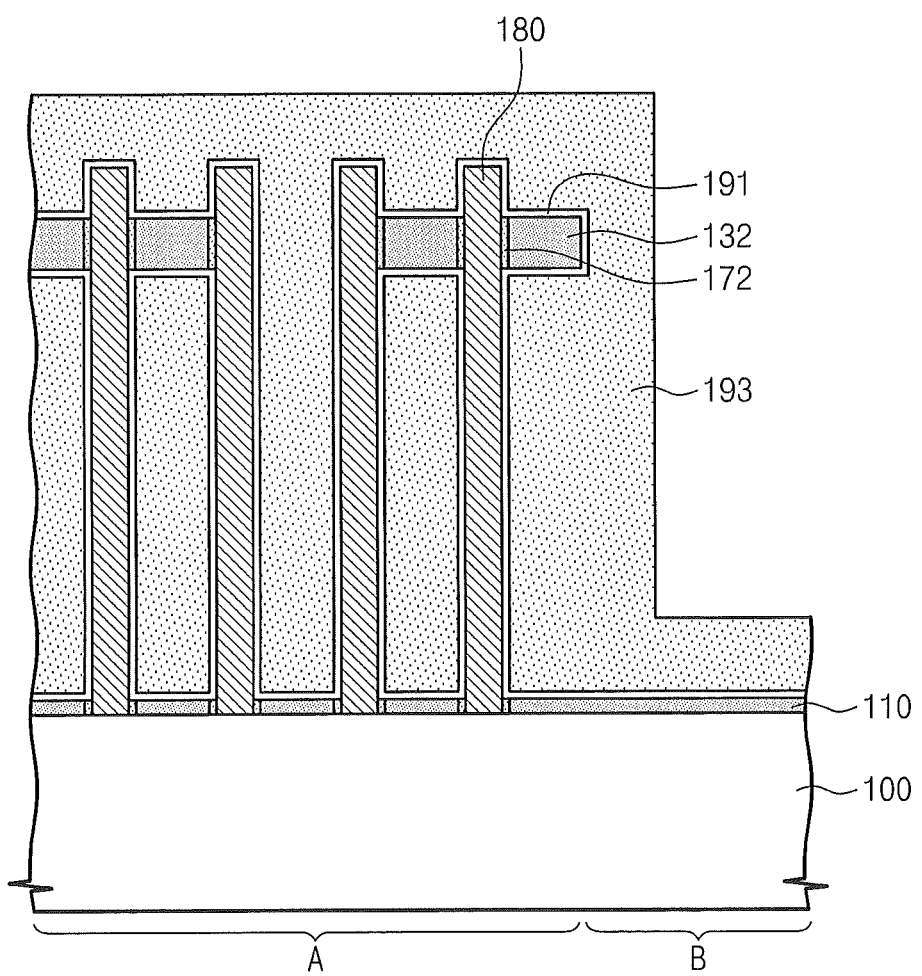

Referring to FIG. 11, a dielectric film 191 and an upper electrode 193 may be sequentially formed on the lower electrodes 180.

The dielectric film 191 and the upper electrode 193 may be formed using a deposition process having a good step coverage property, such as a chemical vapor deposition (CVD), a physical vapor deposition (PVD) or an atomic layer deposition (ALD).

The dielectric film 191 may cover surfaces of the lower electrodes 180 and the supporting pattern 132 conformally. The dielectric film 191 may be formed of, for example, any single film selected from the group consisting of metal oxide such as $HfO_2$, $ZrO_2$, $Al_2O_3$, $La_2O_3$, $Ta_2O_3$ and $TiO_2$ and a dielectric material of perovskite structure such as $SrTiO_3$ (STO), (Ba,Sr)$TiO_3$ (BST), $BaTiO_3$, PZT and PLZT or combinations thereof. Further, the dielectric film 191 may be formed to a thickness of about 50 Å-150 Å.

The upper electrode 193 may include at least one of doped silicon, metal materials, metal nitrides, or metal silicides. For example, in example embodiments, the upper electrode 193 may be formed of high melting point metals (such as, cobalt, titanium, nickel, tungsten and molybdenum). In other embodiments, the upper electrode 193 may be formed of a metal nitride layer (e.g., of titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), or tungsten nitride (WN)). In still other embodiments, the upper electrode 193 may be formed of at least one selected from a group of noble metals consisting of platinum (Pt), ruthenium (Ru), and iridium (Ir). In even other embodiments, the upper electrode 193 may be formed of a conductive noble metal oxide layer such as PtO, $RuO_2$ or $IrO_2$ and a conductive oxide film such as SRO(Sr-$RuO_3$), BSRO(Ba, Sr)$RuO_3$, CRO(Ca$RuO_3$) or LSCo. After the formation of the upper electrode 193, a plasma treatment process and/or a thermal treatment process may be performed to remove impurities or by-products that may be produced during the deposition of the upper conductive layer. The plasma treatment process may be performed using $N_2$ and $H_2$ plasma.

Figure 13:
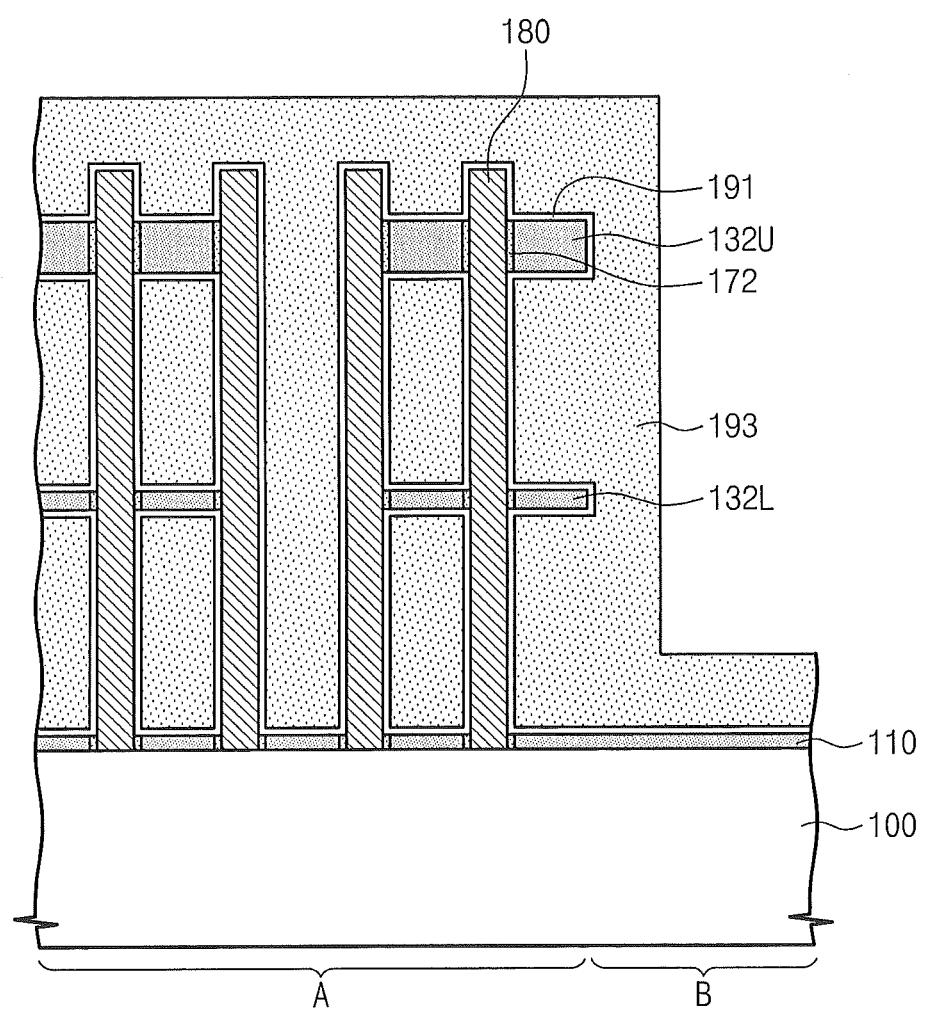
FIG. 13 is a sectional view illustrating a modified structure of a supporting pattern, which may be formed by a method of fabricating a semiconductor device according to example embodiments of the inventive concepts.

FIGS. 12 and 13 are diagrams provided to explain a method of fabricating a semiconductor device according to modifications of example embodiments of the inventive concepts. FIG. 12 is a sectional view illustrating a modified structure of a lower electrode, which may be formed by a method of fabricating a semiconductor device according to example embodiments of the inventive concepts, and FIG. 13 is a sectional view illustrating a modified structure of a supporting pattern, which may be formed by a method of fabricating a semiconductor device according to example embodiments of the inventive concepts.

Referring to FIG. 12, each of the lower electrodes 180 may have a cylindrical structure including a bottom portion and a sidewall portion extending upward from the edge of the bottom portion. The cylindrical lower electrodes 180 may be connected to each other by the supporting pattern 132 with the openings.

Referring to FIG. 13, if the lower electrodes 180 have a high aspect ratio, the number of the supporting patterns 132 may be two or more. For example, the lower electrodes 180 may be supported by a lower supporting pattern 132L and an upper supporting pattern 132U that are located at different levels. In example embodiments, the upper supporting pattern 132U may be thicker than the lower supporting pattern 132L. A protection pattern 172 may be interposed between the lower and upper supporting patterns 132L and 132U and the lower electrodes 180.

FIGS. 14 through 19 are sectional views illustrating a method of fabricating a semiconductor device according to other example embodiments of the inventive concepts and taken along line I-I' of FIG. 1. In the description that follows, a discussion of features identical to those of FIGS. 1 through 13 will be minimized in order to avoid redundancy.

Figure 14:
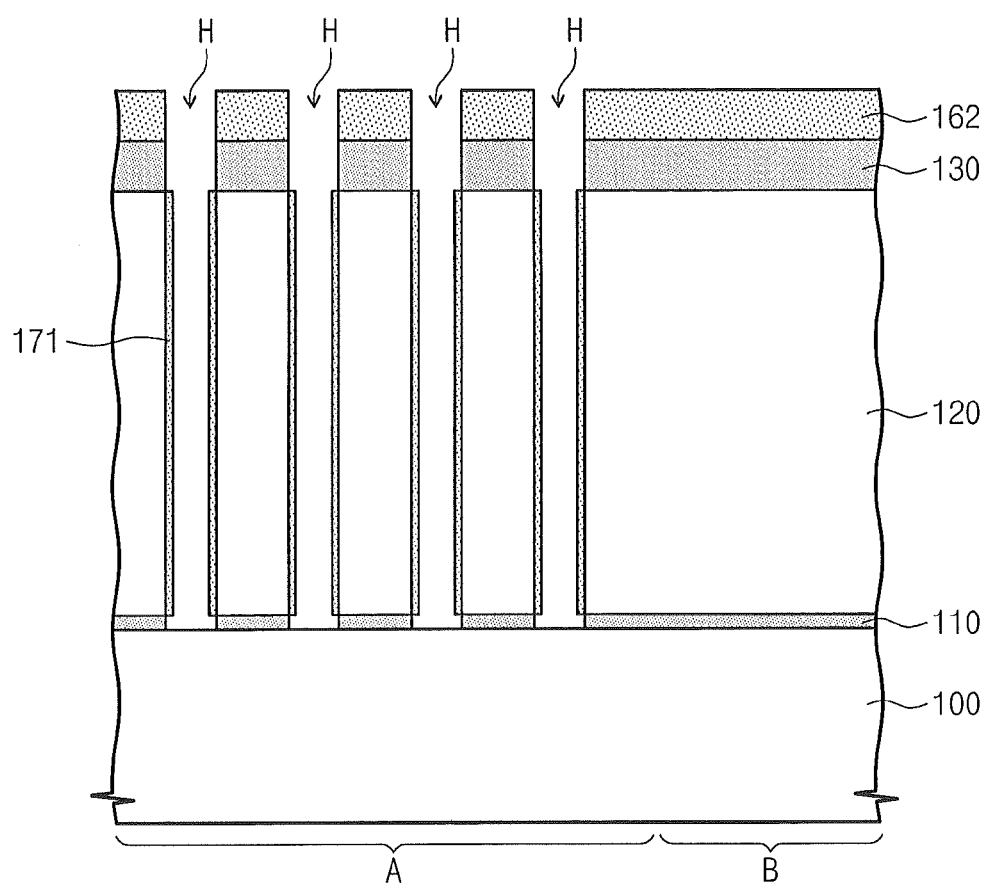
FIGS. 14 through 19 are sectional views illustrating a method of fabricating a semiconductor device according to other example embodiments of the inventive concepts and taken along line I-I' of FIG. 1.

In the present embodiment, after the lower electrode holes H described with reference to FIG. 5, a surface treatment process may be performed on the mold layer 120 exposed by the lower electrode holes H. For example, as shown in FIG. 14, the surface treatment process may be performed to form a protection layer 171 selectively on sidewalls of the mold layer 120 exposed by the lower electrode holes H. Accordingly, a width of the lower electrode hole H defined in the mold layer 120 may be smaller than that in the supporting layer 130. In other example embodiments, the surface treatment process may be performed to form the protection layer 171 on inner sidewalls of the lower electrode holes H in a uniform thickness.

In example embodiments, the formation of the protection layer 171 may be performed by a nitridation process using $N_2O$, NO, $NH_3$ or $N_2/H_2$ plasma or an oxidation process using O2 plasma. In other example embodiments, the formation of the protection layer 171 may be performed by a rapid thermal treatment process (for example, a rapid thermal nitridation (RTN) process using nitrogen source gas (e.g., $N_2$, NO, $N_2O$) or a rapid thermal oxidation process using oxygen source gas (e.g., $O_2$ or $O_3$).

Meanwhile, after the surface treatment process on the sidewall of the mold layer 120, a surface treatment process may be performed on the top surface of the lower structure 100 exposed by the lower electrode holes H. In example embodiments, a hydrogen plasma treatment process may be performed on the top surface of the lower structure 100 exposed by the lower electrode holes H. For example, after the formation of the lower electrode holes H, a first nitrogen plasma treatment and a second hydrogen plasma treatment may be sequentially performed on inner surfaces of the lower electrode holes H. As the result of the nitrogen plasma treatment, the protection layer 171 of silicon nitride may be formed on the sidewall of the mold layer 120. As the result of the hydrogen plasma treatment, it is possible to reduce contact resistance between surfaces of the lower structure 100 and the lower electrodes 180.

Figure 15:
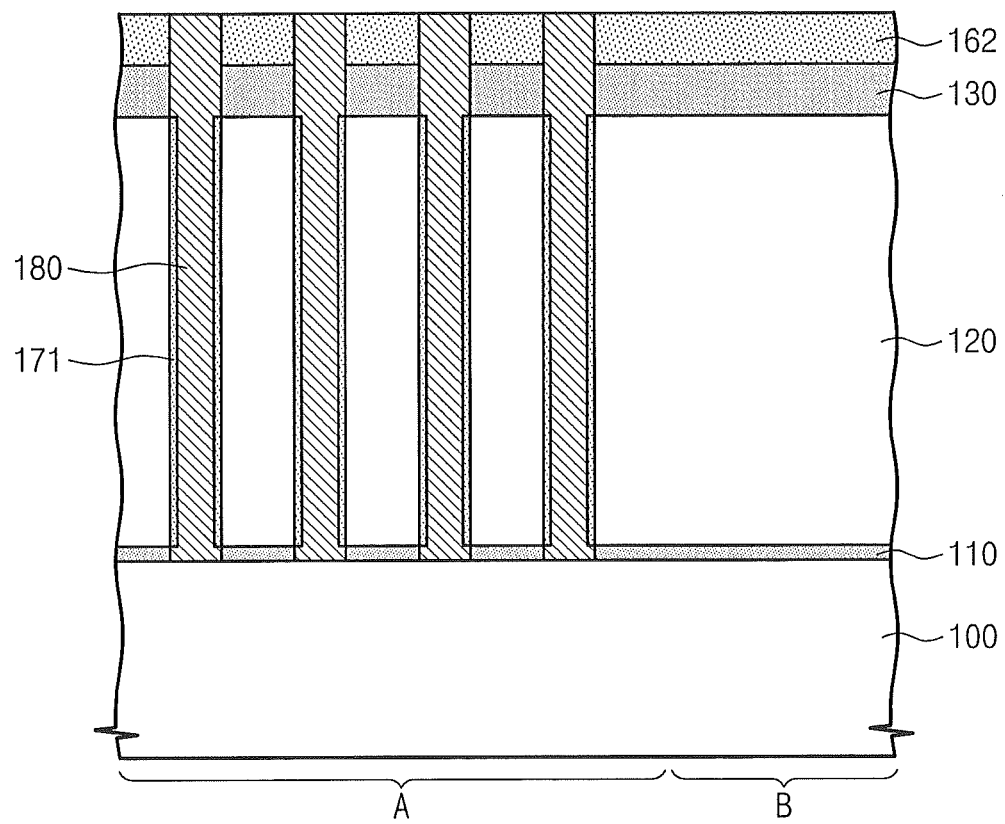

Referring to FIG. 15, the lower electrodes 180 may be formed in the lower electrode holes H provided with the protection layer 171, as described with reference to FIG. 7.

The formation of the lower electrodes 180 may include depositing a conductive layer to fill the lower electrode holes H provided with the protection layer 171, and performing a planarization process to remove the conductive layer from the top surface of the sacrificial mask layer 160 and separate the lower electrodes 180 from each other. In the present embodiment, the conductive layer filling the lower electrode holes H may be formed to be in direct contact with the supporting pattern 132.

Figure 16:
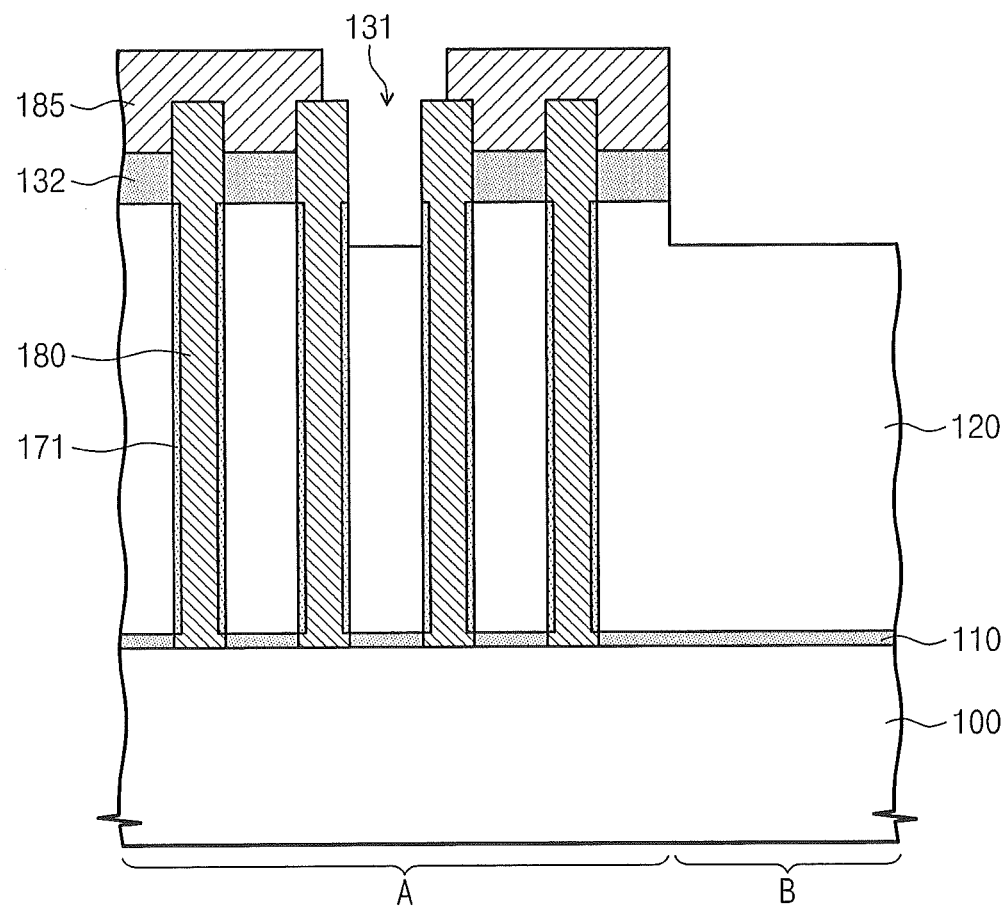

Referring to FIG. 16, as described with reference to FIG. 8, the supporting layer 130 may be patterned to form a supporting pattern 132. The formation of the supporting pattern 132 may include forming a mask pattern on the lower electrodes 180 to expose portions of the supporting layer 130, and then, anisotropically etching the supporting layer 130 using the mask pattern as an etch mask to form openings 131 exposing portions of the mold layer 120. In the present embodiment, the protection layer 171 may be formed to have an high etch selectivity or a low etch rate in the process of anisotropically etching the supporting layer 130, and thus, a portion of the sidewall of the protection layer 171 may be exposed by the opening 131. Alternatively, the portion of the protection layer 171 exposed by the opening 131 may be removed during the process of anisotropically etching the supporting layer 130.

As described above, the etching gas supplied to etch the supporting layer 130 may be reacted with the lower electrode 180 to produce polymer on the exposed surface of the mold layer 120. In this case, after the formation of the supporting pattern 132, an isotropic etching process may be performed to remove residue (e.g., the polymer) from the surface of the mold layer 120.

Figure 17:
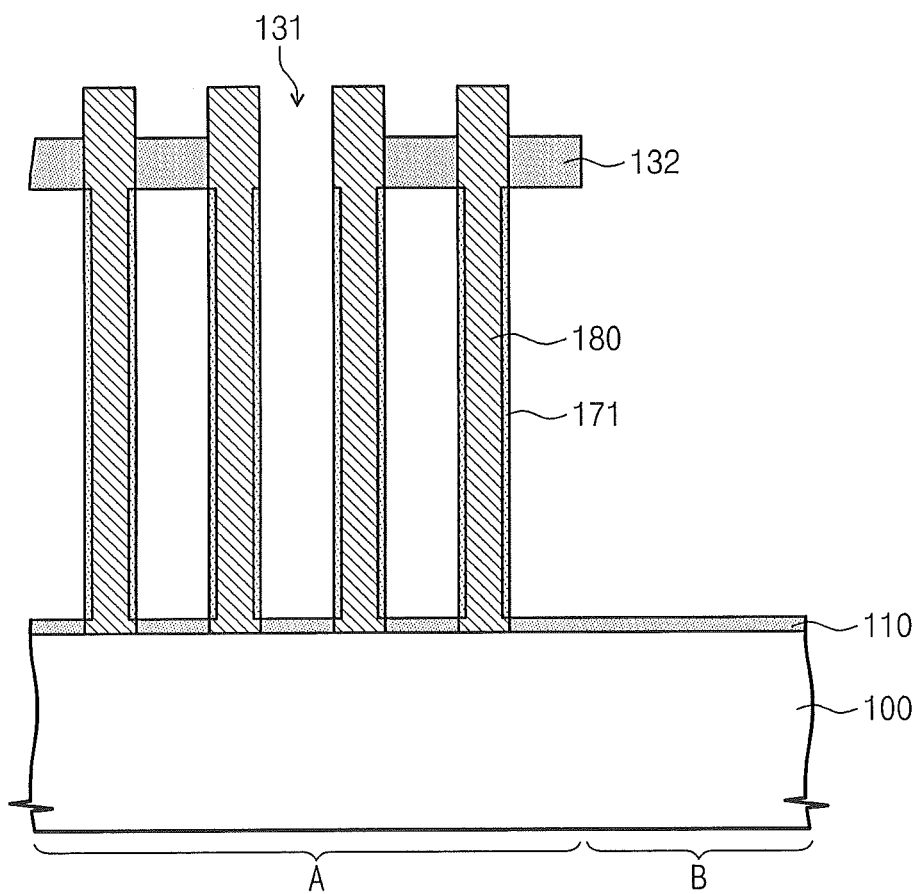

Referring to FIG. 17, as described with reference to FIG. 9, the mold layer 120 may be removed. The mold layer 120 may be removed by an isotropic etching process using an etch recipe having an etch selectivity with respect to supporting pattern 132 and protection layer 171. Since the protection layer 171 is formed to cover the sidewalls of the lower electrodes 180 in the isotropic etching process, it is possible to prevent the sidewalls of the lower electrodes 180 from being exposed to the etching solution in the removal process of the mold layer 120.

Figure 18:
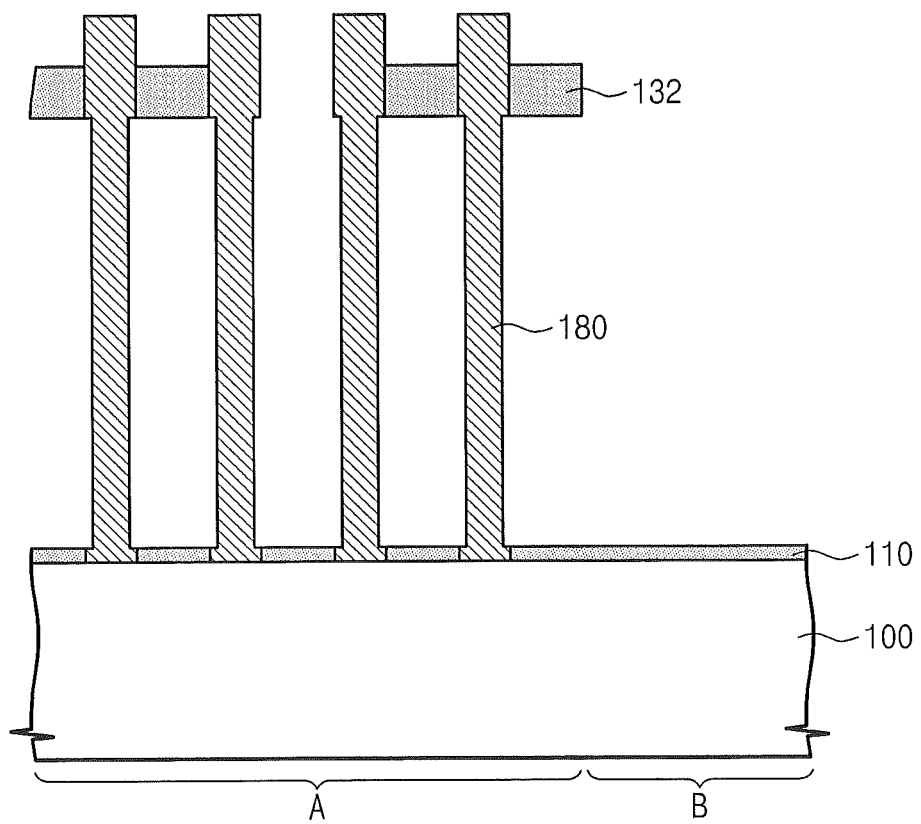

Referring to FIG. 18, the protection layer 171 may be removed to expose the sidewalls of the lower electrodes 180. The protection layer 171 may be removed using an isotropic etching process as described with reference to FIG. 10, and an etch recipe having an etch selectivity with respect to the supporting pattern 132 and the lower electrodes 180 may be used in the removal of the protection layer 171. According to the present embodiment, since the protection layer 171 is formed below the supporting pattern 132, a width of the lower electrode 180 adjacent to the supporting pattern 132 may be smaller than that of the lower electrode 180 below the supporting pattern 132.

Figure 19:
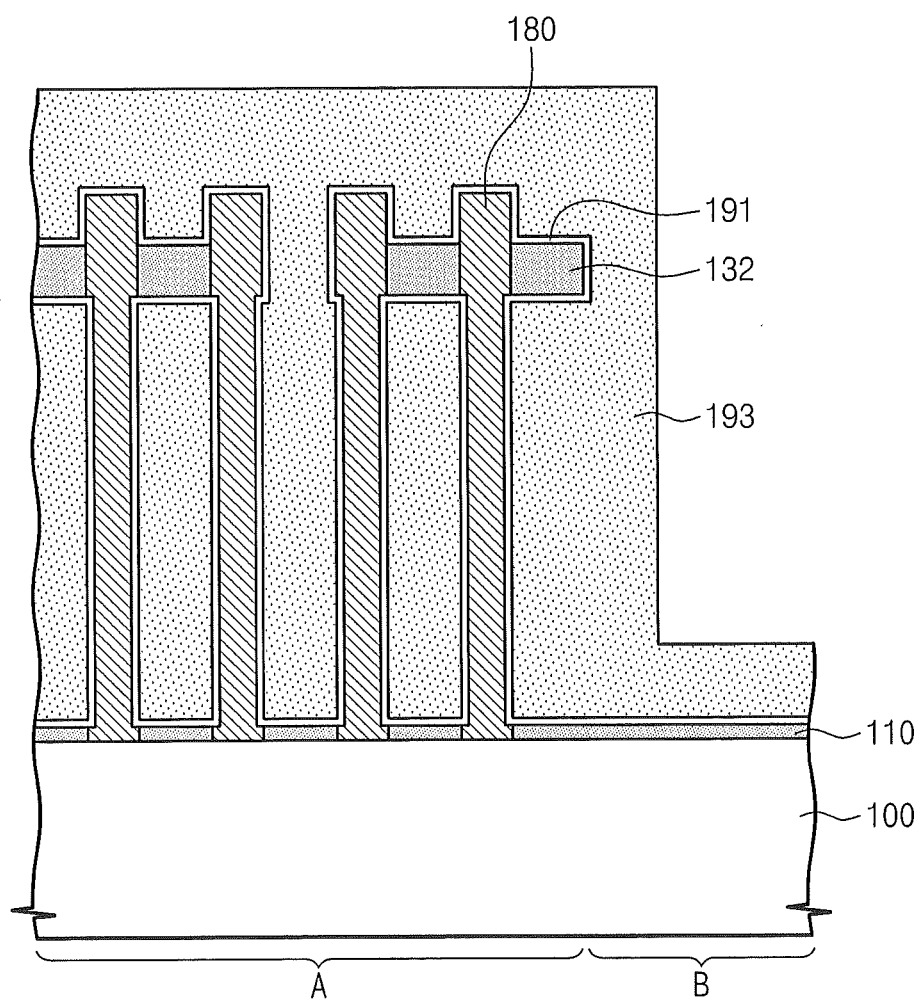

Referring to FIG. 19, the dielectric film 191 and the upper electrode 193 may be sequentially formed on the lower electrodes 180, as previously described with reference to FIG. 11.

Figure 20:
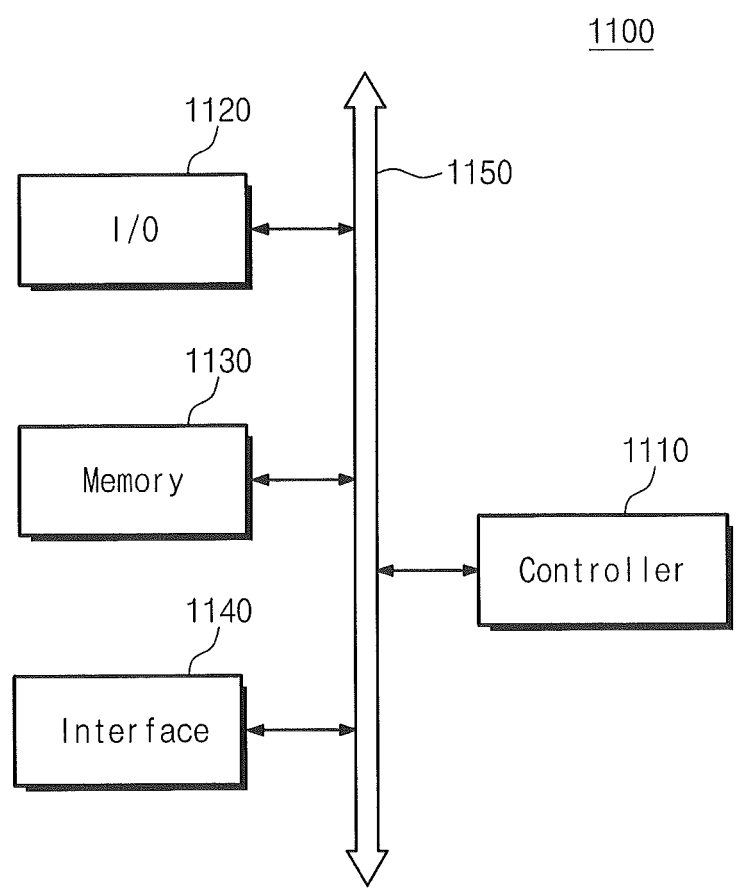
FIG. 20 is a schematic block diagram illustrating a memory system including a semiconductor device according to example embodiments of the inventive concepts.

FIG. 20 is a schematic block diagram illustrating a memory system including a semiconductor device according to example embodiments of the inventive concepts.

Referring to FIG. 20, an electronic system 1100 may include a controller 1110, an input-output (I/O) unit 1120, a memory device 1130, an interface 1140, and a bus 1150. The controller 1110, the input-output unit 1120, the memory device 1130 and/or the interface 1140 may be connected or coupled to each other via the bus 1150 serving as a pathway for data communication. At least one of the controller 1110, the input-output unit 1120, the memory device 1130, and/or the interface 1140 may include a semiconductor device according to example embodiments of the inventive concepts.

The controller 1110 may include, e.g., at least one of a microprocessor, a digital signal processor, a microcontroller, or another logic device. The other logic device may have a similar function to any one of the microprocessor, the digital signal processor, and the microcontroller. The input-output unit 1120 may include a keypad, keyboard, a display device, and so forth. The memory device 1130 may be configured to store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to, for example, a personal digital assistant (PDA), a portable computer, a web tablet, a wireless phone, a mobile phone, a digital music player, a memory card, or other electronic products. The other electronic products may receive or transmit information data by wireless.

Figure 21:
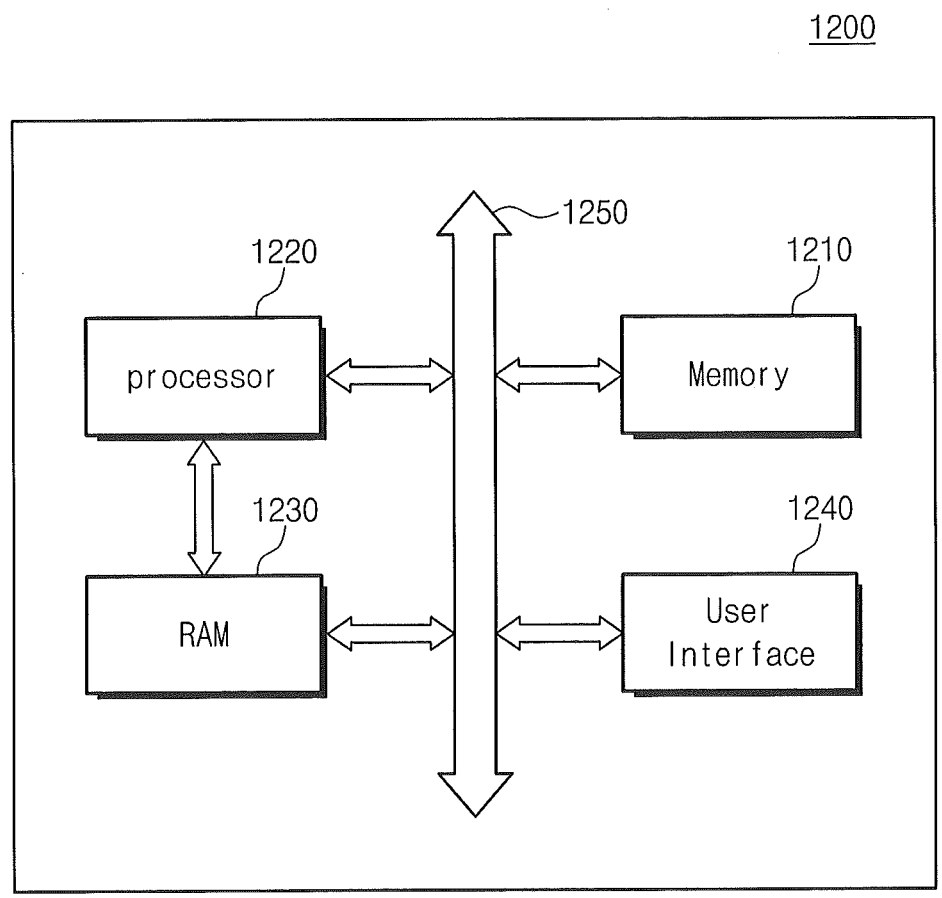
FIG. 21 is a schematic block diagram illustrating an example of an electronic system including a semiconductor memory device according to embodiments of the inventive concepts.

FIG. 21 is a schematic block diagram illustrating an example of an electronic system including a semiconductor memory device according to embodiments of the inventive concepts.

Referring to FIG. 21, an electronic system 1200 may include at least one of the semiconductor memory devices according to the embodiments mentioned above. The electronic system 1200 may include a mobile device or a computer. As an illustration, the electronic system 1200 may include a memory system 1210, a processor 1220, a random access memory (RAM) 1230, and a user interface 1240 that that are electrically connected to a bus 1250. The processor 1220 may be configured to execute programs and control the electronic system 1200. The RAM 1230 may be used as an operating memory of the processor 1220. For example, all or each of the processor 1220 and the RAM 1230 may include the semiconductor device according to example embodiments of the inventive concepts. Alternatively, the processor 1220 and the RAM 1230 may be provided as components of a semiconductor package. The user interface 1240 may be used to input/output data to/from the electronic system 1200. The memory system 1210 may be configured to store code for operating the processor 1220, data processed by the processor 1220 or data inputted from the outside. The memory system 1210 may include a controller and a memory device.

The electronic system 1200 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1200 performs wireless communication, the electronic system 1200 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

According to example embodiments of the inventive concepts, lower electrode holes may be formed in a mold layer, in which lower electrodes will be provided, and a protection layer may be formed on sidewalls of the mold layer exposed by the lower electrode holes. Accordingly, when the mold layer is removed after the formation of the lower electrodes, the lower electrodes can be prevented from being exposed by an etching solution supplied to remove the mold layer. As a result, it is possible to prevent surfaces of the lower electrodes from being damaged or to prevent etching side products from remaining on the surfaces of the lower electrodes, in the process of removing the mold layer.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
    forming a mold structure on a lower structure;
    patterning the mold structure to form a plurality of holes exposing the lower structure;
    forming a protection layer on sidewalls of the mold structure exposed by the holes;
    forming lower electrodes in the holes provided with the protection layer;
    removing the mold structure to expose the protection layer;
    removing the protection layer to expose sidewalls of the lower electrodes; and
    sequentially forming a dielectric film and an upper electrode on the lower electrodes;
    wherein the forming of the mold structure comprises sequentially stacking a mold layer and a supporting layer having an etch selectivity with respect to the mold layer, on the lower structure, and
    wherein the protection layer is locally formed on the sidewall of the mold layer to expose a sidewall of the supporting layer.

2. The method of claim 1, wherein the protection layer comprises a material having an etch selectivity with respect to the mold structure and the lower electrodes.

3. The method of claim 1, wherein the protection layer comprises a silicon oxide layer, a silicon nitride layer, or a silicon oxynitride layer.

4. The method of claim 1, wherein the forming of the protection layer comprises:
    depositing a surface protection layer conformally on a surface of the mold structure with the holes; and removing the surface protection layer from a top surface of the lower structure exposed by the holes to expose the top surface of the lower structure.

5. The method of claim 1, wherein the forming of the protection layer comprises treating the sidewalls of the mold structure exposed by the holes with plasma produced from at least one of hydrogen, oxygen, or nitrogen.

6. The method of claim 1, wherein the removing of the protection layer comprises locally forming a protection pattern between the lower electrodes and the supporting layer.

7. A method of fabricating a semiconductor device, comprising:
    forming a mold structure on a lower structure;
    patterning the mold structure to form a plurality of holes exposing the lower structure;
    forming a protection layer on sidewalls of the mold structure exposed by the holes;
    forming lower electrodes in the holes provided with the protection layer;
    removing the mold structure to expose the protection layer;
    removing the protection layer to expose sidewalls of the lower electrodes; and
    sequentially forming a dielectric film and an upper electrode on the lower electrodes;
    wherein the forming of the mold structure comprises sequentially stacking a mold layer and a supporting layer having an etch selectivity with respect to the mold layer, on the lower structure, and
    wherein the supporting layer comprises openings exposing portions of the mold layer.

8. The method of claim 1, wherein the removing of the mold structure is performed to remove the mold layer using an isotropic etching process having an etch selectivity with respect to the protection layer and the supporting layer.

9. The method of claim 1, further comprising, after forming the lower electrodes, patterning the supporting layer to form a supporting pattern with openings partially exposing sidewalls of the lower electrodes.

10. The method of claim 1, wherein the mold layer comprises a single-crystalline silicon layer, an amorphous silicon layer, a doped silicon layer, a silicon germanium layer, or a carbon-based material.

11. The method of claim 1, wherein the supporting layer is formed of SiN, SiCN, TaO, or $TiO_2$.

12. The method of claim 1, wherein a width of the lower electrode is smaller than that of the hole.

13. A method of fabricating a semiconductor device, comprising:
    forming on a first structure, a second structure having a plurality of holes therein that expose the first structure;
    forming a first layer on sidewalls of the second structure that are exposed by the holes;
    forming a second layer that is conductive, on inner sidewalls of the first layer in the holes;
    removing the first structure to expose outer sidewalls of the first layer;
    removing the first layer to expose the second layer;
    forming a third layer that is insulating, on the second layer that was exposed;
    forming a fourth layer that is conductive, on the third layer; and
    forming a fifth layer on the second structure prior to the removing the first structure;
    wherein at least some of the fifth layer remains between adjacent outer sidewalls of the first layer after the removing the first structure to expose outer sidewalls of the first layer and after the removing the first layer to expose the second layer.

14. The method of claim 13 wherein the forming a second layer comprises forming a second layer that is conductive, on inner sidewalls of the first layer in the holes, so as to not fill the holes.

15. The method of claim 14 wherein the forming a third layer comprises forming a third layer that is insulating, on the second layer that was exposed, so as to not fill the holes.

16. The method of claim 13 wherein the forming a first layer comprises surface treating the sidewalls of the second structure that are exposed by the holes.

* * * * *